(12) United States Patent
Yoon et al.

(10) Patent No.: US 11,310,926 B2
(45) Date of Patent: Apr. 19, 2022

(54) FLEXIBLE DISPLAY APPARATUS

(71) Applicant: LG Display Co., Ltd., Seoul (KR)

(72) Inventors: Kyoung Sang Yoon, Paju-si (KR); Sangdae Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/928,935

(22) Filed: Jul. 14, 2020

(65) Prior Publication Data

US 2021/0105902 A1 Apr. 8, 2021

(30) Foreign Application Priority Data

Oct. 7, 2019 (KR) .......................... 10-2019-0124099

(51) Int. Cl.
*H05K 5/00* (2006.01)
*H01F 7/02* (2006.01)
*H05K 5/02* (2006.01)

(52) U.S. Cl.
CPC ............ *H05K 5/0017* (2013.01); *H01F 7/02* (2013.01); *H05K 5/0217* (2013.01)

(58) Field of Classification Search
None
See application file for complete search history.

(56) References Cited

U.S. PATENT DOCUMENTS

| | | | | |
|---|---|---|---|---|
| 9,829,922 B2 * | 11/2017 | Hong | ................... | G06F 1/1652 |
| 9,836,087 B2 * | 12/2017 | Kim | ..................... | G06F 1/1652 |
| 10,175,792 B2 * | 1/2019 | Kim | ..................... | G06F 3/0412 |
| 10,319,263 B2 * | 6/2019 | Lee | ....................... | G06F 1/1652 |
| 10,488,886 B2 * | 11/2019 | Browne | ................... | H01F 7/06 |
| 10,617,017 B2 * | 4/2020 | Park | ..................... | H05K 5/0217 |
| 10,775,848 B2 * | 9/2020 | Kim | ..................... | G06F 1/1652 |
| 2006/0192726 A1 * | 8/2006 | Huitema | ................. | G06F 1/169 |
| | | | | 345/1.1 |
| 2008/0086925 A1 * | 4/2008 | Yang | ....................... | G09F 9/301 |
| | | | | 40/610 |
| 2011/0227822 A1 * | 9/2011 | Shai | ..................... | G06F 1/1615 |
| | | | | 345/156 |
| 2015/0116921 A1 * | 4/2015 | Hsu | ....................... | G06F 1/1624 |
| | | | | 361/679.27 |
| 2015/0146387 A1 * | 5/2015 | Lee | ....................... | G06F 1/1679 |
| | | | | 361/749 |
| 2016/0349971 A1 * | 12/2016 | Chi | ..................... | G06F 3/04845 |
| 2017/0205855 A1 * | 7/2017 | Szeto | .................. | H04M 1/0216 |
| 2020/0090846 A1 * | 3/2020 | Hsu | ....................... | H01F 7/0252 |

FOREIGN PATENT DOCUMENTS

KR 10-2008-0054950 A 6/2008
KR 10-2009-0069022 A 6/2009

* cited by examiner

*Primary Examiner* — Xanthia C Cunningham
(74) *Attorney, Agent, or Firm* — Polsinelli PC

(57) ABSTRACT

A flexible display apparatus includes a display panel, a housing movably supporting the display panel, and a magnetic portion coupled to each of the display panel and the housing, wherein the magnetic portion includes a first magnetic portion coupled to one side of the display panel, having a first magnetism, and a second magnetic portion including a first magnetic member coupled to the housing to face the first magnetic portion, having the first magnetism and a second magnetic member having a second magnetism opposite to the first magnetism.

18 Claims, 11 Drawing Sheets

FLEXIBLE DISPLAY APPARATUS

CROSS REFERENCE TO RELATED APPLICATION

This application claims priority from Korean Patent Application No. 10-2019-0124099, filed on Oct. 7, 2019, which is hereby incorporated by reference in its entirety.

BACKGROUND

Field of the Disclosure

The present disclosure relates to a flexible display apparatus.

Description of the Background

Recently, with the advancement of the information age, a display field for processing and displaying mass information has been rapidly developed, and correspondingly, various flat panel display apparatuses have been developed and spotlighted.

Since the flat panel display apparatus uses a glass substrate to resist high heat generated during a manufacturing process, there is limitation in lightweight and thin profile and flexibility.

Therefore, a flexible display apparatus manufactured using a flexible material such as plastic instead of a glass substrate having no flexibility to maintain display performance even though it is bent like a paper has emerged as an advanced flat panel display apparatus.

By using a plastic substrate instead of glass, flexible display apparatuses may be categorized into unbreakable display apparatuses having high durability, bendable display apparatuses which are not broken and are bendable, rollable display apparatuses capable of being rolled, foldable display apparatuses, and slidable display apparatuses enabling a screen to be unfolded therefrom and inserted thereinto. Such flexible display apparatuses are good in space usability, interior, and design and may be applied to various application fields.

Particularly, research of slidable display apparatuses is being actively done for improving thinness, weight-lightness, miniaturization, and portability recently.

SUMMARY

The present disclosure has been made in view of the above problems and provides a flexible display apparatus that may enlarge or downsize a display area while minimizing a user's force.

In accordance with an aspect of the present disclosure, the above and other objects can be accomplished by the provision of a flexible display apparatus comprising a display panel, a housing movably supporting the display panel, and a magnetic portion coupled to each of the display panel and the housing, wherein the magnetic portion includes a first magnetic portion coupled to one side of the display panel, having a first magnetism, and a second magnetic portion including a first magnetic member coupled to the housing to face the first magnetic portion, having the first magnetism and a second magnetic member having a second magnetism opposite to the first magnetism.

In the flexible display apparatus according to the present disclosure, as a display area is enlarged or downsized by a user's hand gesture using a magnetic force, the user's force may be minimized. Since the enlarged or downsized state of the display area may be maintained using the magnetic force, a separate fixing device is not required, whereby a whole size and weight of the flexible display apparatus may be reduced.

In the flexible display apparatus according to the present disclosure, since a separate driving power for enlarging and downsizing a display area is not required, a whole size and weight of the flexible display apparatus may be reduced to enhance convenience in storage and movement.

In addition to the effects of the present disclosure as mentioned above, additional advantages and features of the present disclosure will be clearly understood by those skilled in the art from the above description of the present disclosure.

BRIEF DESCRIPTION

The above and other objects, features and other advantages of the present disclosure will be more clearly understood from the following detailed description taken in conjunction with the accompanying drawings, in which.

DETAILED DESCRIPTION

Figure 1A:
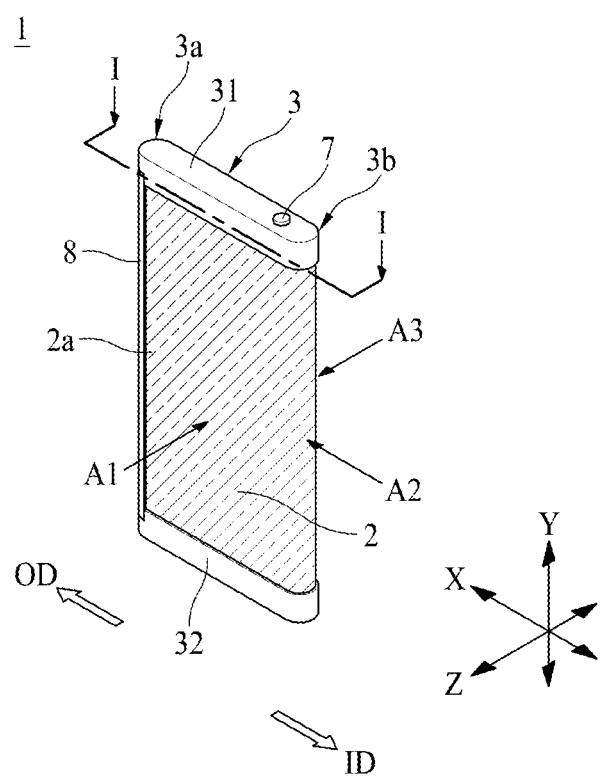
FIG. 1A is a schematic front perspective view illustrating an inserted state of a flexible display apparatus according to one aspect of the present disclosure.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first", "second", etc. may be used. These terms are intended to identify the corresponding elements from the other elements, and basis, order, or number of the corresponding elements are not limited by these terms. The expression that an element is "connected" or "coupled" to another element should be understood that the element may directly be connected or coupled to another element but may directly be connected or coupled to another element unless specially mentioned, or a third element may be interposed between the corresponding elements.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Hereinafter, a flexible display apparatus according to the present disclosure will be described in detail with reference to the accompanying drawings. Wherever possible, the same reference numbers will be used throughout the drawings to refer to the same or like parts.

Figure 1B:
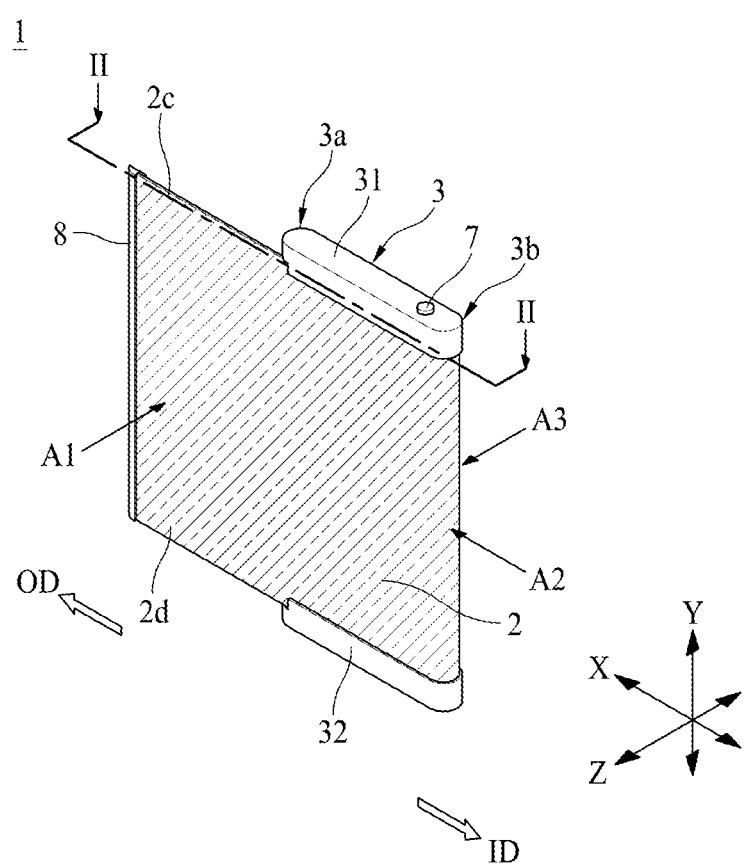
FIG. 1B is a schematic front perspective view illustrating an unfolded state of a flexible display apparatus according to one aspect of the present disclosure.
Figure 1C:
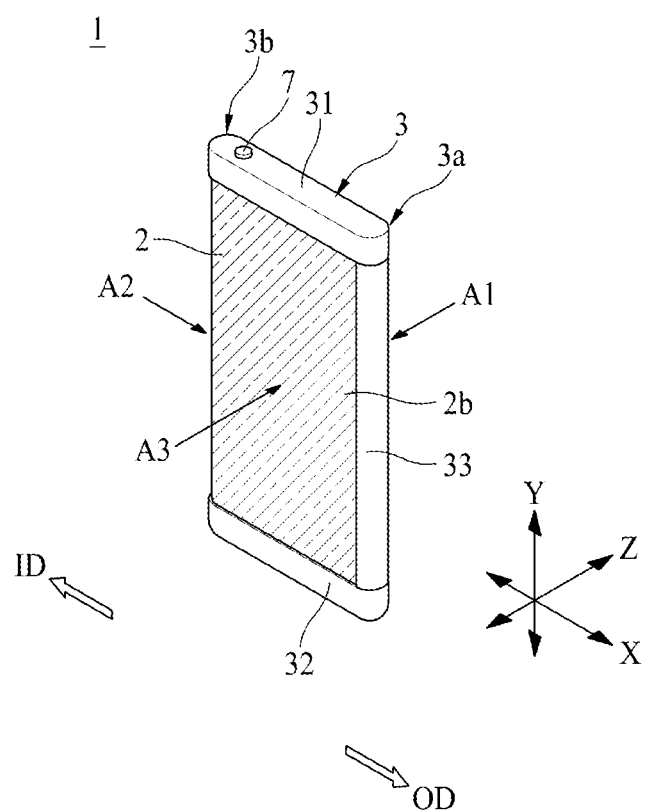
FIG. 1C is a schematic rear perspective view illustrating an inserted state of a flexible display apparatus according to one aspect of the present disclosure.
Figure 2:
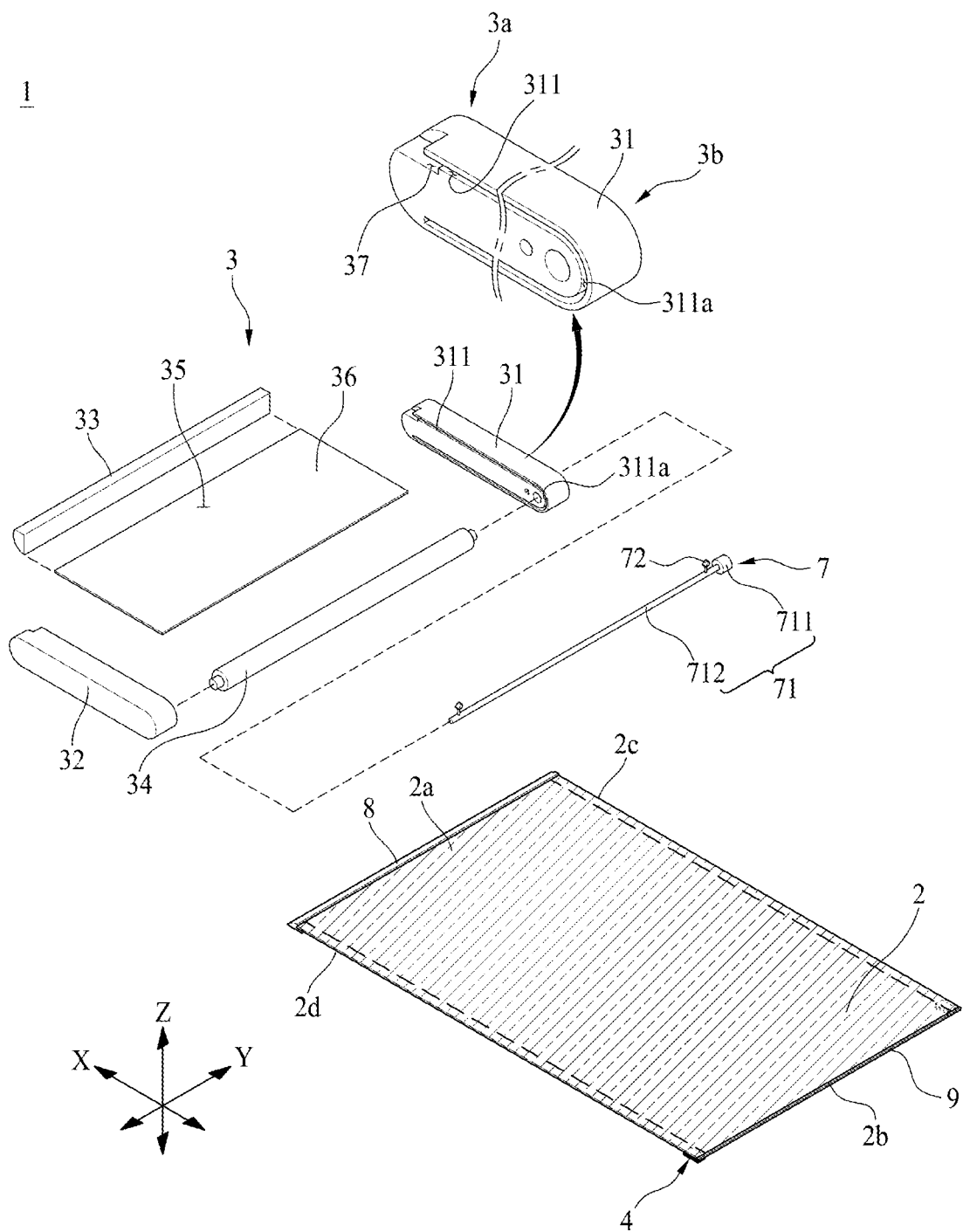
FIG. 2 is a schematic exploded perspective view of a flexible display apparatus according to one aspect of the present disclosure.
Figure 3:
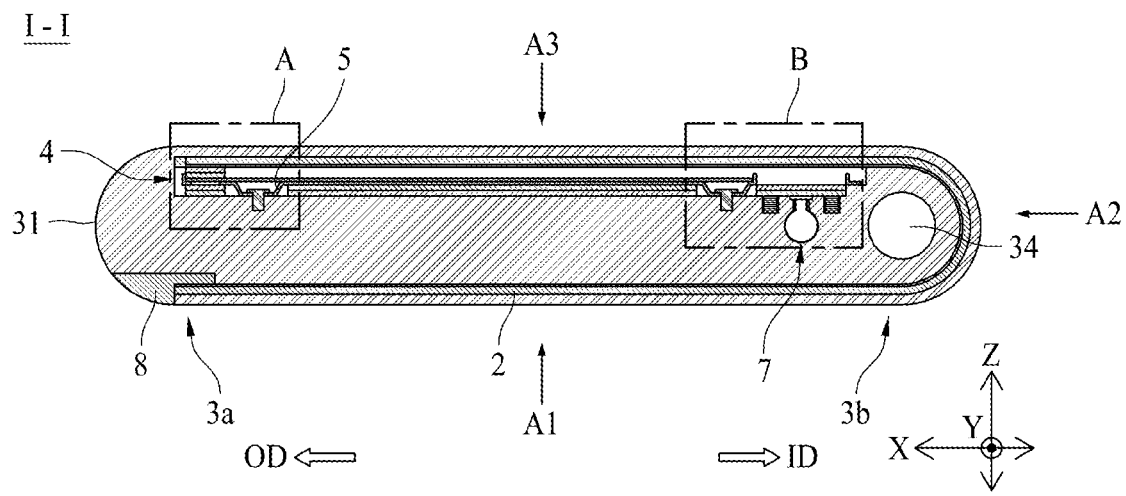
FIG. 3 is a schematic cross-sectional view taken along line I-I shown in FIG. 1A.
Figure 4:
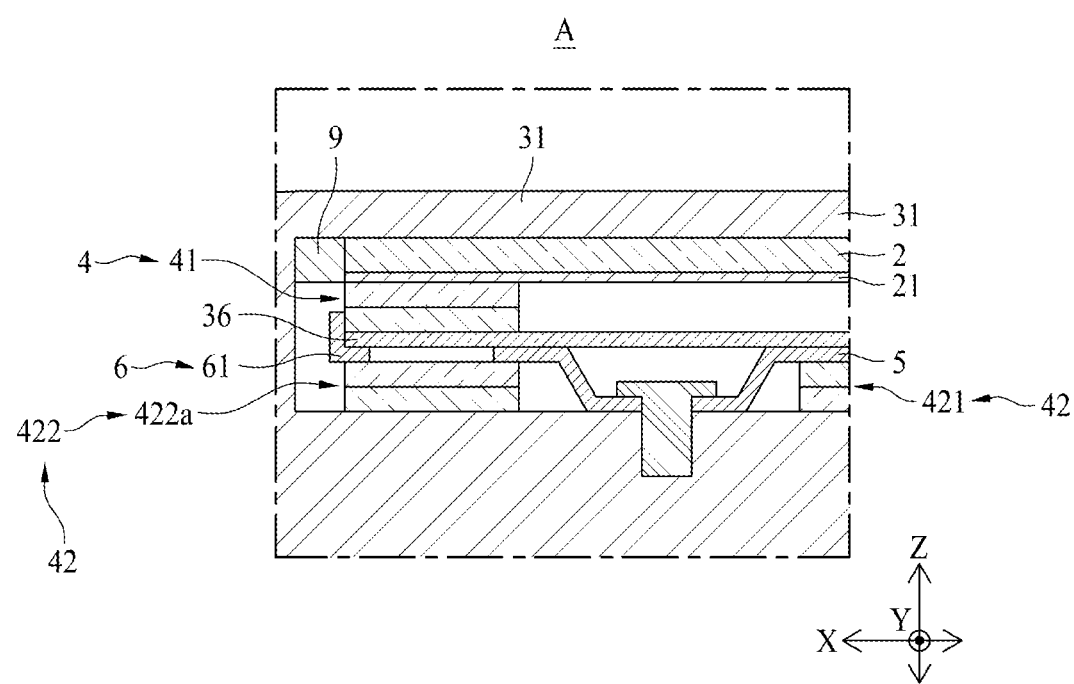
FIG. 4 is a schematic enlarged view of portion A shown in FIG. 3.
Figure 5A:
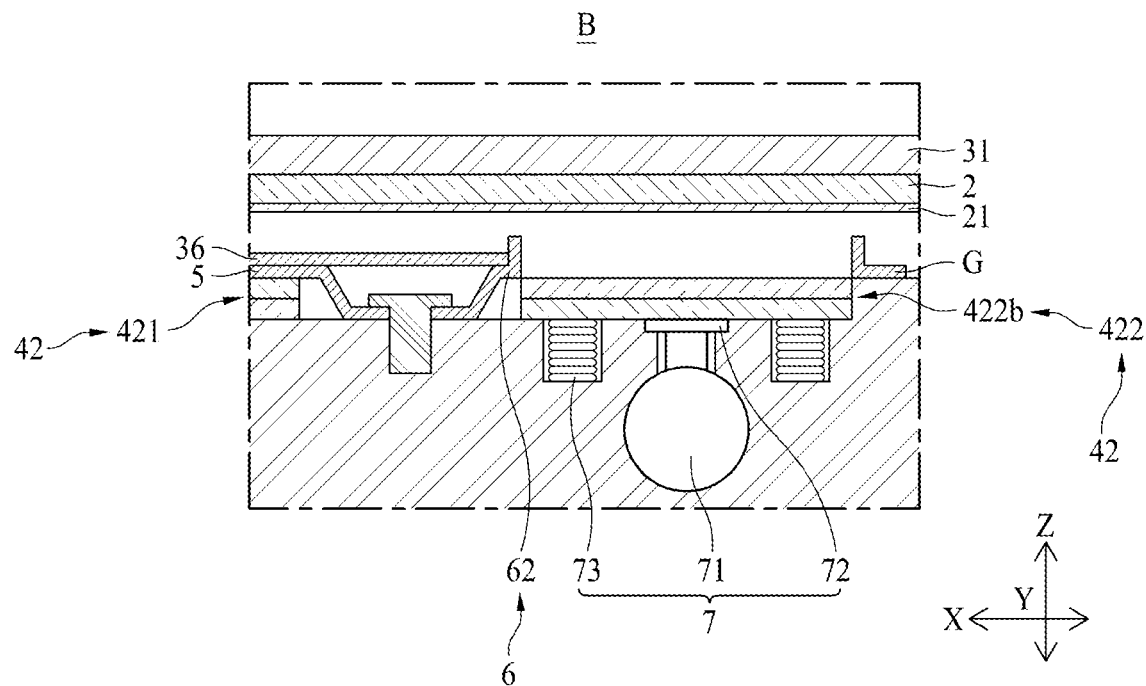
FIG. 5A is a schematic enlarged view of portion B shown in FIG. 3.
Figure 5B:
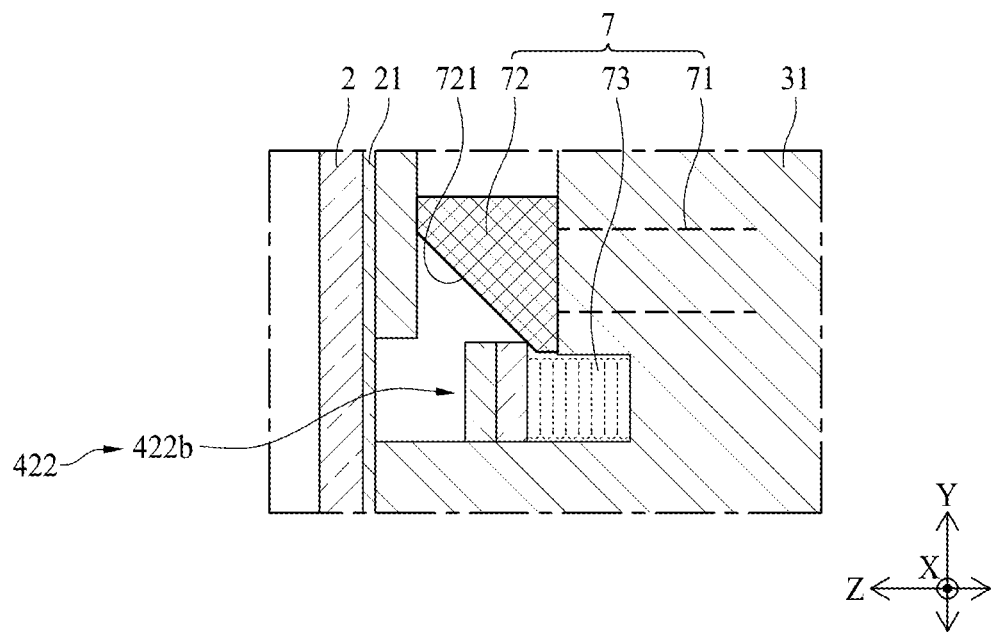
FIG. 5B is a schematic side view of FIG. 5A.
Figure 6A:
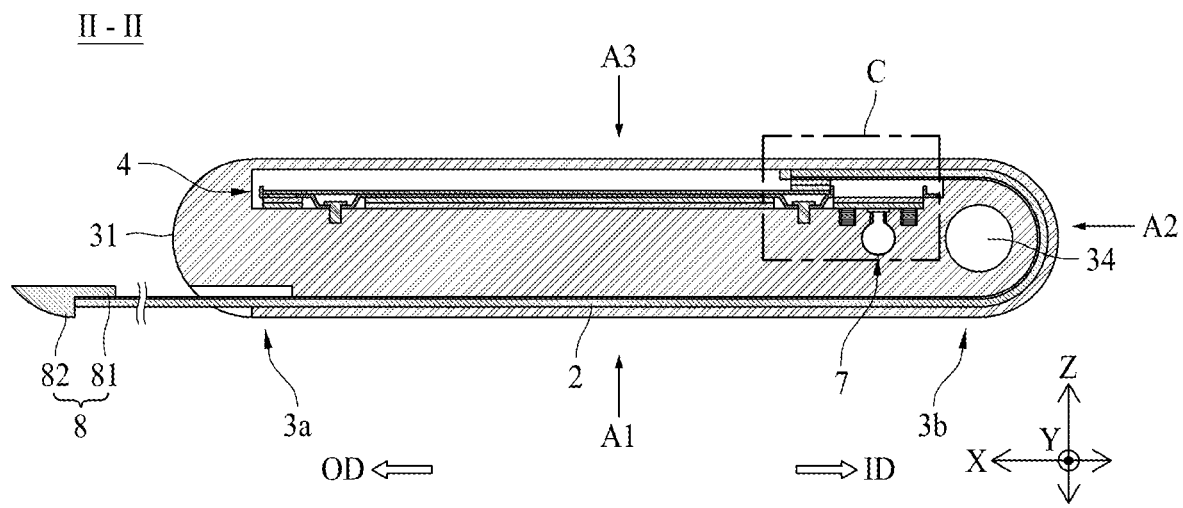
FIG. 6A is a schematic cross-sectional view taken along line II-II shown in FIG. 1B.
Figure 6B:
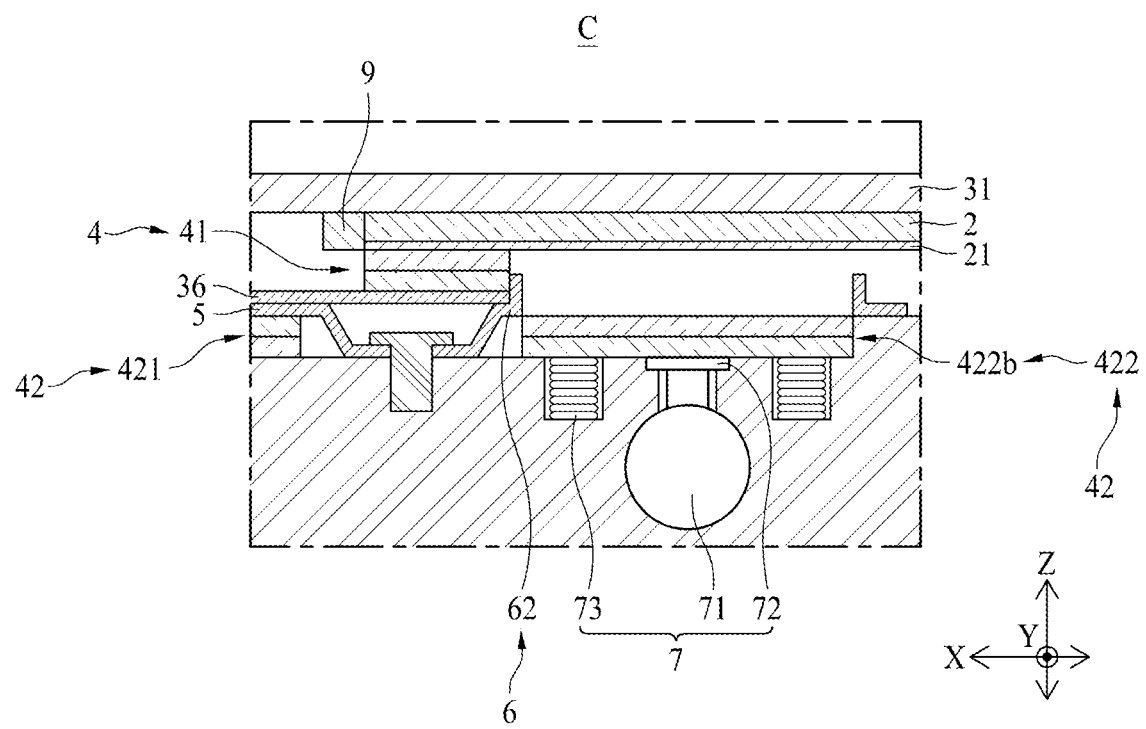
FIG. 6B is a schematic enlarged view of portion C shown in FIG. 6A.
Figure 7A:
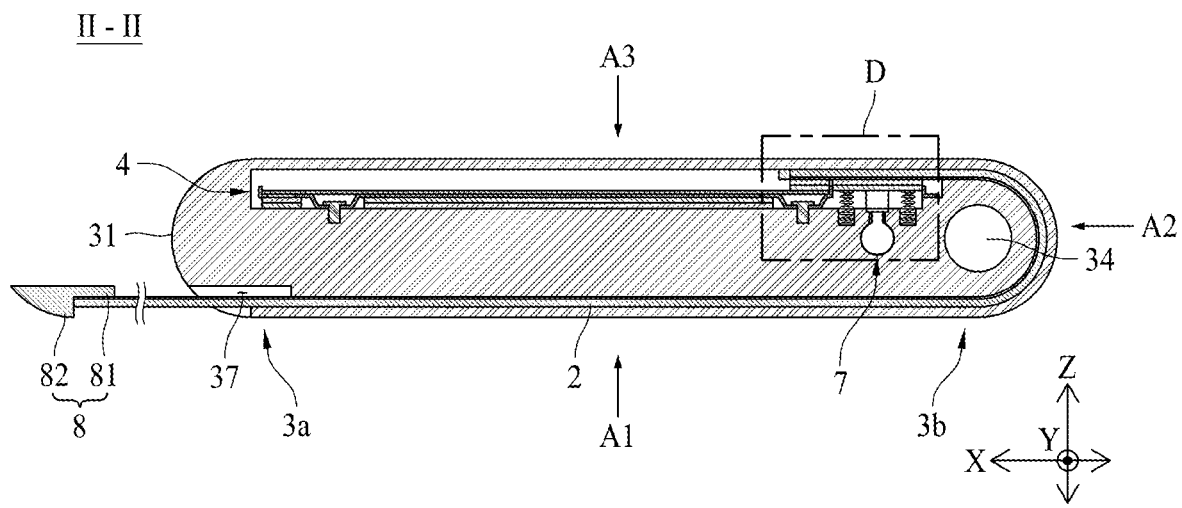
FIG. 7A is a schematic cross-sectional view taken along line II-II shown in FIG. 1B when an unfolded state is shifted to an inserted state.
Figure 7B:
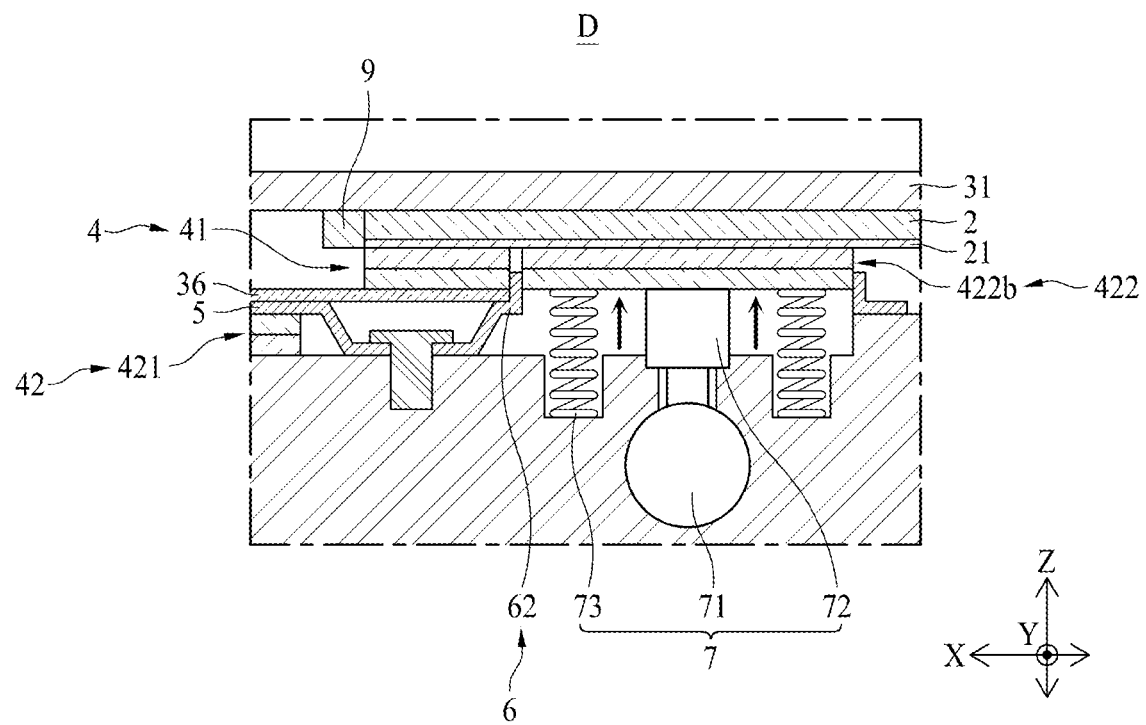
FIG. 7B is a schematic enlarged view of portion D shown in FIG. 7A.
Figure 7C:
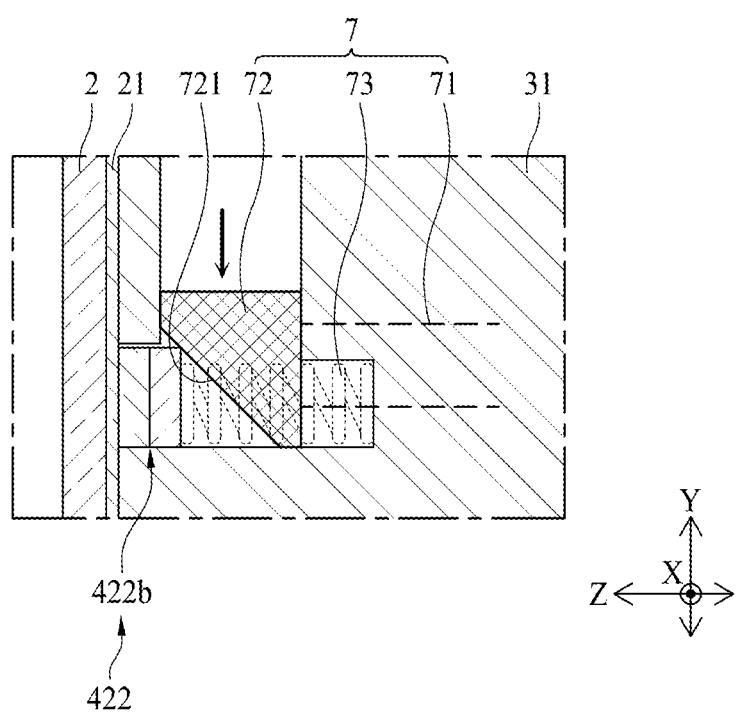
FIG. 7C is a schematic side view of FIG. 7B.

FIG. 1A is a schematic front perspective view illustrating an inserted state of a flexible display apparatus according to one aspect of the present disclosure, FIG. 1B is a schematic front perspective view illustrating an unfolded state of a flexible display apparatus according to one aspect of the present disclosure, FIG. 1C is a schematic rear perspective view illustrating an inserted state of a flexible display apparatus according to one aspect of the present disclosure, FIG. 2 is a schematic exploded perspective view of a flexible display apparatus according to one aspect of the present disclosure, FIG. 3 is a schematic cross-sectional view taken along line I-I shown in FIG. 1A, FIG. 4 is a schematic enlarged view of portion A shown in FIG. 3, FIG. 5A is a schematic enlarged view of portion B shown in FIG. 3, FIG. 5B is a schematic side view of FIG. 5A, FIG. 6A is a schematic cross-sectional view taken along line II-II shown in FIG. 1B, FIG. 6B is a schematic enlarged view of portion C shown in FIG. 6A, FIG. 7A is a schematic cross-sectional view taken along line II-II shown in FIG. 1B when an unfolded state is shifted to an inserted state, FIG. 7B is a schematic enlarged view of portion D shown in FIG. 7A, and FIG. 7C is a schematic side view of FIG. 7B.

Referring to FIGS. 1A to 7C, the flexible display apparatus 1 according to one aspect of the present disclosure may include a display panel 2, a housing 3, and a magnetic portion 4. The magnetic portion 4 may include a first magnetic portion 41 having a first magnetism, and a second magnetic portion 42 having a first magnetism and a second magnetism. At this time, the second magnetic portion 42 includes a first magnetic member 421 having a first magnetism and a second magnetic member 422 having a second magnetism.

The flexible display apparatus 1 according to one aspect of the present disclosure may further include a gap retainer 5, a stopper portion 6, a button portion 7, a first coupling member 8, and a second coupling member 9.

The display panel 2 may be a display apparatus that outputs an image. The display panel 2 may be a flexible display panel which is manufactured by using a material having flexibility like plastic so as to maintain display performance even when being bent like paper. The display panel 2 according to one example may have a wholly tetragonal plate shape, but is not limited thereto and may have another shape. The display panel 2 may include one side 2a, the other side 2b, a first side 2c, and a second side 2d.

Referring to FIG. 2, the one side 2a and the other side 2b are a direction parallel with X-axis direction, and may mean a direction vertical to Y-axis direction. For example, the X-axis direction may be a direction in which the display panel 2 moves. The first side 2c may be one side in the Y-axis direction and may denote an upper portion. The second side 2d may be the other side in the Y-axis direction and may denote a lower portion. For example, the Y-axis direction may be a direction parallel with a direction on which gravity acts, but is not limited thereto. Z-axis direction may be a direction perpendicular to each of the X-axis direction and the Y-axis direction, and for example, may mean a front area A1 and a rear area A3 with reference to FIG. 1A. In this case, the front area A1 means an area of located at one side of the display apparatus 1. The rear area A3 is an area located at an opposite side of display apparatus 1. A side area A2 may be disposed between the front area A1 and the rear area A3. The display panel 2 may be disposed in each of the front area A1, the side area A2 and the rear area A3, and areas of the display panel 2 disposed in the front area A1, the side area A2 and the rear area A3 may display different images.

The display panel 2 may movably be coupled to the housing 3. The display panel 2 according to one example may be moved to enlarge an area of the display panel 2 disposed in the front area A1 as shown in FIG. 1B, or may be moved to reduce the area of the display panel 2 disposed in the front area A1 as shown in FIG. 1A. Hereinafter, a direction in which an area of the display panel 2 disposed in the front area A1 is enlarged may be referred to as an unfolding direction (an OD arrow direction), and a direction in which the area of the display panel 2 disposed in the front area A1 is reduced may be referred to as an inserting direction (an ID arrow direction). Also, a state where the area of the display panel 2 disposed in the front area A1 is enlarged based on movement of the display panel 2 in the unfolding direction (the OD arrow direction) may be defined as an unfolded state, and a state where the area of the display panel 2 disposed in the front area A1 is reduced based on movement of the display panel 2 in the inserting direction (the ID arrow direction) may be defined as an inserted state.

The display panel 2 may be moved based on manipulation by the user in the unfolding direction (the OD arrow direction). For example, the user may grip or contact one side 2a of the display panel 2 with a hand and may move the display panel 2 in the unfolding direction (the OD arrow direction). However, the present disclosure is not limited the above example, and the user may contact an arbitrary portion of the display panel 2 exposed to the front area A1 and may move the display panel 2 in the unfolding direction (the OD arrow direction). The one side 2a of the display panel 2 may mean an end portion of the display panel 2 disposed in the front area A1 in the unfolding direction (the OD arrow direction). In a state that a size of the display panel 2 disposed in the front area A1 is enlarged, the display panel 2 may be moved by the magnetic portion 4 at a predetermined distance in the inserting direction (the ID arrow direction).

The display panel 2, as shown in FIGS. 1A and 1B, may be provided in a bent state or rolling state. Therefore, the display panel 2 disposed at the rear area A3 may be moved along a moving direction of the display panel 2 to be disposed at the front area A1.

As the display panel 2 moves in the unfolding direction (the OD arrow direction), portion of the display panel 2 disposed at the front area A3 may be disposed at the front area A1. In this case, the inside of the flexible display apparatus 1 according to one aspect of the present disclosure, which is covered by the display panel 2 disposed at the rear area A3, may be exposed. In the flexible display apparatus 1 according to one aspect of the present disclosure, a cover 36 (shown in FIG. 2) may be disposed at the rear area A3, whereby the inside of the flexible display apparatus 1 may be prevented from being expose to the outside.

As the display panel 2 moves in the unfolding direction (the OD arrow direction), a size of the display panel 2 exposed at the front area A1 may be increased, and thus the user may view a wider-range image or a zoomed-in image compared to before the size is increased.

As the display panel 2 moves in the inserting direction (the ID arrow direction), portion of the display panel 2 disposed at the front area A1 may again be disposed at the rear area A3.

The first side 2c and the second side 2d of the display panel 2 may be coupled to the housing 3. The first side 2c of the display panel 2 means an upper side portion of the display panel 2 in FIG. 1B. The second side 2d of the display panel 2 means a lower side portion of the display panel 2 in FIG. 1B. The first side 2c and the second side 2d of the display panel 2 may be inserted into a guide groove formed in the housing 3.

As the first magnetic portion 41 is disposed at the first side 2c and the second side 2d of the display panel 2 and the second magnetic portion 42 is disposed in the housing 3, when the display panel 2 is enlarged or downsized, a user's force may be minimized using a magnetic force of the first magnetic portion 41 and the second magnetic portion 42, and the enlarged and downsized state of the display panel 2 may be maintained using the magnetic force of the magnetic portion 4.

Referring to FIGS. 1A to 7B, the display panel 2 may movably be coupled to the housing 3. The housing 3 may configure a wholly external appearance of the flexible display apparatus 1 and may be provided in a tetragonal plate shape of which inner portion is empty, but is not limited thereto. The housing 3 may include a first housing sidewall 31, a second housing sidewall 32, a third housing sidewall 33, and a guide roller 34. The housing 3 may further include an accommodating groove 35, a cover 36, and a coupling groove 37.

The first housing sidewall 31 may be a frame which is disposed in an upper side of the flexible display apparatus 1 as shown in FIGS. 1A to 5B. The first side 2c of the display panel 2 may be coupled to the first housing sidewall 31. The first housing sidewall 31 may be provided in a wholly long oval shaped section, but is not limited thereto and may be provided in another shape for supporting the first side 2c of the display panel 2. The first housing sidewall 31 may include one side and the other side. One side of the first housing sidewall 31 may be one side 3a of the housing 3, and the other side of the first housing side 31 may be the other side of the housing 3.

In the inserted state, the one side 3a of the first housing sidewall 31 may be portion where the one side 2a of the display panel 2 is disposed. The other side 3b of the first housing sidewall 31 may be portion opposite to the one side 3a based on the display panel 2 disposed in the front area A1 and may be portion where the guide roller 34 is disposed.

The first housing sidewall 31 may include a guide groove 311 for guiding the first side 2c of the display panel 2, and portion of the magnetic portion 4. In this case, the portion of the magnetic portion 4 may be a second magnetic portion 42.

The guide groove 311 may be provided in an engraved form in the first housing sidewall 31 as illustrated in FIG. 2. Therefore, the first side 2c of the display panel 2 may be inserted into the guide groove 311. The display panel 2 inserted into the guide groove 311 may be moved along the guide groove 311 by a driving force provided by the user. The first magnetic portion 41 coupled to the display panel 2 may be inserted into the guide groove 311 together with the display panel 2. Also, the second magnetic portion 42 may be disposed in the first housing sidewall 31 where the guide groove 311 is formed. Therefore, as the display panel 2 moves, attraction and repulsion may act between the second magnetic portion 42 and the first magnetic portion 41.

The guide groove 311 may be provided in the first housing sidewall 31 in a wholly laid U-shape. In this case, one side of the guide groove 311 may be communicated with the outside so that the one side 2a of the display panel 2 is unfolded from the one side 3a of the first housing sidewall 31 at a predetermined distance. The other side of the guide groove 311 may not be communicated with the outside so that, when the display panel 2 is moving in the inserting direction (the ID arrow direction), the other side 2b of the display panel 2 is supported by the first housing sidewall 31 and thus does not move in the inserting direction (the ID arrow direction).

The guide groove 311 may further include a curve portion 311A for bending the display panel 2. The curve portion 311A may be formed in the first housing sidewall 31 so as to be disposed at the other side 31B of the first housing sidewall 31. The curve portion 311A may be provided in a semicircular shape, and its curvature radius may be set to be equal to or slightly greater than a radius of the guide roller 34 provided in a cylindrical shape. Therefore, the curve portion 311A may be provided to surround the guide roller 34. Therefore, the display panel 2 disposed in the curve portion 311A may be bent to surround the guide roller 34.

The flexible display apparatus 1 according to one aspect of the present disclosure may be embodied so that the display panel 2 disposed in the curve portion 311A displays an image which differs from an image displayed by the display panel 2 disposed in portion other than the curve portion 311A. For example, the display panel 2 disposed in the curve portion 311A may display simple information, such as text messages of Kakaotalk, weather and time, and another image. Since the curve portion 311A may be disposed at the side area A2, the flexible display apparatus 1 may display the simple information on the side area A2. The display panel 2 disposed in the front area A1 other than the curve portion 311A may display the simple information in more detail or may display a large-screen image such as a television (TV) or movie. Also, the display panel 2 disposed at the rear area A3 other than the curve portion 311A may display another image such as an application or an icon. Without limitation to this case, the display panel 2 may display the same image as that of the front area A1 or an image different from that of the front area A1. As a result, in the flexible display apparatus 1 according to one aspect of the present disclosure, at least one of a first area of the display panel 2 disposed at the front area A1, a second area of the display panel 2 disposed at the side area A2 and a third area of the display panel 2 disposed at the rear area A3 may be provided to display a different image.

The different areas of the display panel 2 may be disposed at the side area A2 in accordance with the unfolded state or the inserted state of the display panel 2. The flexible display apparatus 1 according to one aspect of the present disclosure may be provided to always display simple information regardless of the unfolded state or the inserted state of the display panel 2 disposed at the side area A2 unlike the display panel 2 disposed at the front area A1 or the rear area A3, thereby enabling the user to easily recognize the simple information through the side area A2.

The second housing sidewall 32 may be a frame disposed at a lower side of the flexible display apparatus 1. The second housing sidewall 32 may be disposed in parallel with the first housing sidewall 31. The second housing sidewall 32 may be spaced apart from the first housing sidewall 31 at a predetermined distance. For example, the second housing sidewall 32 may be spaced apart from the first housing sidewall 31 as much as a length of the third housing sidewall 33. The second side 2d of the display panel 2 may be coupled to the second housing sidewall 32. The second housing sidewall 32 may be formed in the same shape as that of the first housing sidewall 31, and thus the first side 2c and the second side 2d of the display panel 2 may be maintained in a flat state. The second housing sidewall 32 may include a guide groove for guiding the second side 2d of the display panel 2. The guide groove of the second housing sidewall 32 may further include a curve portion. The guide groove and the curve portion of the second housing sidewall 32 may be provided to be symmetrical with the guide groove 311 and the curve portion 311A of the first housing sidewall 31. However, the second housing sidewall 32 and the first housing sidewall 31 may have the same function and effect, and thus their detailed description will be omitted.

The second housing sidewall 32 may include one side and the other side. One side of the housing sidewall 32 is portion disposed to face one side 3a of the first housing sidewall 31. In more detail, in the inserted state, the one side of the second housing sidewall 32 may be portion where the one side 2a of the display panel 2 is disposed. The other side of the second housing sidewall 32 is portion disposed to face the other side 3b of the first housing sidewall 31. In more detail, the other side of the second housing sidewall 32 is portion where the guide roller 34 is disposed.

The flexible display apparatus 1 according to one aspect of the present disclosure may be embodied as a compact type in that the display panel 2 is folded in a bent state due to the curve portion 311A of the guide groove 311. Also, in the flexible display apparatus 1 according to one aspect of the present disclosure, the first side 2c and the second side 2d of the display panel 2 may respectively be inserted into the guide groove of the first housing sidewall 31 and the guide groove of the second housing sidewall 32, whereby the first housing sidewall 31 and the second housing sidewall 32 may support the display panel 2. Therefore, even when the user touches or moves the display panel 2, the flexible display apparatus 1 according to one aspect of the present disclosure may prevent the display panel 2 from being deformed such as bending.

The third housing sidewall 33 is connected to the one side 3a of the first housing sidewall 31 and the one side of the second housing sidewall 32. The third housing sidewall 33 according to one example is intended to couple the first housing sidewall 31 to the second housing sidewall 32. The third housing sidewall 33 may be coupled to each of the first housing sidewall 31 and the second housing sidewall 32 by using various coupling methods such as an adhesive coupling method, a fitting-coupling method, and a bolt-coupling method. The third housing sidewall 33 may have a long rod shape which is long in length, and for example, may include a cross-sectional surface having a fan shape. As shown in FIGS. 2 and 3, when the one side 2a of the display panel 2 is inserted into the housing 3, the third housing sidewall 33 may contact a first coupling member 8 which will be described later.

Referring to FIGS. 2 and 3 again, the guide roller 34 may be disposed at the other sides of the first and second housing sidewalls 31 and 32. The guide roller 34 according to one example may be disposed between the first housing sidewall 31 and the second housing sidewall 32. The guide roller 34 may contact an inner surface of the display panel 2. In more detail, the guide roller 34 may contact an inner surface of a bending portion of the display panel 2 disposed in the curve portion 311A. In this case, the inner surface of the display panel 2 may be a non-display surface which does not display an image. Therefore, the guide roller 34 may support the non-display surface regardless of that the display panel 2 displays an image, whereby the user may easily change the inserted state and the unfolded state even when an image is being displayed. Therefore, the guide roller 34 may support the bending portion of the display panel 2, thereby preventing the bending portion of the display panel 2 from being recessed toward the accommodating groove 35 or preventing the flat state from being deformed.

The guide roller 34 may rotate in accordance with movement of the display panel 2. The guide roller 34 according to one example may rotate clockwise when the one side 2a of the display panel 2 moves in the unfolding direction (the OD arrow direction). The guide roller 34 according to one example may rotate counterclockwise when the one side 2a of the display panel 2 moves in the inserting direction (the ID arrow direction). On the other hand, the guide roller 34 may rotate counterclockwise when the one side 2a of the display panel 2 moves in the unfolding direction (the OD arrow direction) and may rotate clockwise when the one side 2*a* of the display panel 2 moves in the inserting direction (the ID arrow direction). Therefore, in the flexible display apparatus 1 according to one aspect of the present disclosure, since the guide roller 34 rotates together with movement of the display panel 2, the bending portion of the display panel 2 may be prevented from being deformed in shape, and moreover, friction occurring in the display panel 2 may decrease compared to a case where there is no rotation, thereby extending a lifetime of the display panel 2.

In the flexible display apparatus 1 according to one aspect of the present disclosure, it has been described that the first housing sidewall 31, the second housing sidewall 32, the third housing sidewall 33, and the guide roller 34 are separately manufactured and are coupled to the housing 3, but the present disclosure is not limited thereto. In other aspects, unless the guide roller 34 is rotatable, the first housing sidewall 31, the second housing sidewall 32, the third housing sidewall 33, and the guide roller 34 may be provided as one body. When the housing 3 is provided as one body, a manufacturing time of a complete flexible display apparatus 1 may be shortened.

In the flexible display apparatus 1 according to one aspect of the present disclosure, the first housing sidewall 31, the second housing sidewall 32, and the third housing sidewall 33 other than the guide roller 34 may be provided as one body and only the guide roller 34 may be manufactured separately, and the first housing sidewall 31, the second housing sidewall 32, and the third housing sidewall 33 may rotatably be coupled to the guide roller 34. The first housing sidewall 31, the second housing sidewall 32, and the third housing sidewall 33 may be provided to surround an edge of the display panel 2, thereby protecting the display panel 2 from an impact applied from the outside.

Referring to FIG. 2, the accommodating groove 35 is intended to accommodate additional devices required to display image, such as a printed circuit board (PCB) including circuits for driving of the display panel 2, communication, and driving of a set and a battery for supplying a power to the PCB. The accommodating groove 35 according to one example may be a space surrounded by the first housing sidewall 31, the second housing sidewall 32, the third housing sidewall 33, and the guide roller 34. A partial area of the display panel 2 may be disposed at the front area A1 to cover the accommodating groove 35, and the cover 36 may be disposed at the rear area A3. As the additional devices are disposed in the accommodating groove 35, the additional devices may not interfere with movement of the display panel 2.

The cover 36 is intended to cover the accommodating groove 35. The cover 36 according to one example may be coupled to the housing 3 so as to be disposed at the rear area A3 of the flexible display apparatus 1. The cover 36 may be detachably coupled to the first housing sidewall 31, the second housing sidewall 32, and the third housing sidewall 33 of the housing 3. The cover 36 may be provided in a wholly tetragonal plate shape, but is not limited thereto and may be provided in another shape which is coupled to the housing 3 to cover the accommodating groove 35. The cover 36 may be formed of the same material as that of the housing 3 to enhance a sense of unity and a sense of beauty, but is not limited thereto and may be formed of another material. The cover 36 may be formed of a plastic material for weight-lightness. A surface, exposed to the outside, of the cover 36 may be provided to have various patterns such as a concave-convex pattern or a surface of high friction to be prevented from sliding from the user's hand.

Referring to FIGS. 3 to 7C, the magnetic portion 4 may be coupled to each of the display panel 2 and the housing 3. The magnetic portion 4 according to one example may be coupled to one side of the display panel 2, and may include a first magnetic portion 41 coupled to one side of the display panel 2, having a first magnetism, and a second magnetic portion 42 coupled to the housing 3 to face the first magnetic portion 41. The second magnetic portion 42 may include a first magnetic member 421 having a first magnetism and a second magnetic member 422 having a second magnetism. The second magnetism may be opposite to the first magnetism.

The first magnetic portion 41 has a first magnetism. Referring to FIGS. 8A to 8D, the first magnetic portion 41 includes N pole and S pole, wherein the N pole may be disposed below the S pole. In this specification, the first magnetism of the first magnetic portion 41 means a magnetic pole disposed in a down direction in a structure where the S pole and the N pole are disposed up and down. Therefore, the first magnetism of the first magnetic portion 41 facing the second magnetic portion 42 may be the N pole.

The first magnetic member 421 of the second magnetic portion 42 has a first magnetism. Referring to FIGS. 8A to 8D, the first magnetic member 421 includes N pole and S pole, wherein the S pole may be disposed below the N pole. In this specification, the first magnetism of the first magnetic member 421 means a magnetic pole disposed in an up direction in a structure where the N pole and the S pole are disposed up and down. Therefore, the first magnetism of the first magnetic member 421 facing the first magnetic portion 41 may be the N pole.

The second magnetic member 422 of the second magnetic portion 42 has a second magnetism. Referring to FIGS. 8A to 8D, the second magnetic member 422 includes N pole and S pole, wherein the N pole may be disposed below the S pole. In this specification, the second magnetism of the second magnetic member 422 means a magnetic pole disposed in an up direction in a structure where the S pole and the N pole are disposed up and down. Therefore, the second magnetism of the second magnetic member 422 facing the first magnetic portion 41 may be the S pole.

In conclusion, the first magnetic portion 41 having a first magnetism which is N pole may be disposed in the display panel 2, and the second magnetic member 421 having a first magnetism which is N pole and the second magnetic member 422 having a second magnetism which is S pole may be disposed in the housing 3.

Since attraction acts between the different poles, that is, the N pole and the S pole, the N pole and the S pole may pull each other. Since repulsion acts on the same poles, that is, between the N pole and the N pole or between the S pole and the S pole, the same poles may push each other.

The flexible display device 1 according to one aspect of the present disclosure may minimize the user's force by using attraction and repulsion acting between the first magnetic portion 41 and the second magnetic portion 42 when the user enlarges or downsizes the display panel 2, and may maintain the display panel 2 at the inserting state and the unfolding state by using attraction. Therefore, since a separate fixing device is not required, a whole size and weight may be reduced.

In the flexible display device 1 according to one aspect of the present disclosure, the first magnetic member 421 and the second magnetic member 422 may alternately be disposed to be spaced apart from each other. That is, the N pole and the S pole may alternately be disposed to be spaced apart from each other.

Referring to FIGS. 3 to 7B, the second magnetic member 422 may be provided in a plural number. According to one example, two second magnetic member 422 may be provided such that one may be disposed at the one side 3a of the first housing sidewall 31 and the other one may be disposed at the other side 3b of the first housing sidewall 31. The second magnetic member disposed at the one side 3a of the first housing sidewall 31 is referred to as a first sub magnetic member 422a, and the second magnetic member disposed at the other side 3b of the first housing sidewall 31 is referred to as a second sub magnetic member 422b. The first magnetic member 421 may be disposed between the first sub magnetic member 422a and the second sub magnetic member 422b.

Since the first magnetic member 421 and the second magnetic member 422 have their respective poles different from each other, they may be disposed to be spaced apart from each other without being formed in a single body. A spaced distance between the first magnetic member 421 and the second magnetic member 422 may be a distance where the first magnetic member 421 and the second magnetic member 422 are not mutually affected by a magnetic force.

Consequently, the first sub magnetic member 422a, the first magnetic member 421, and the second sub magnetic member 422b, as shown in FIG. 3, may alternately be disposed to be spaced apart from one another between the one side 3a and the other side 3b of the first housing sidewall 31.

The first sub magnetic member 422a, the first magnetic member 421, and the second sub magnetic member 422b may be disposed along the moving direction of the display panel 2. For example, as shown in FIGS. 3 to 5A, the first sub magnetic member 422a, the first magnetic member 421, and the second sub magnetic member 422b may be disposed along the X-axis direction. Therefore, if the first magnetic portion 41 moves in the X-axis direction in accordance with movement of the display panel 2, the first magnetic portion 41 may be close to the first sub magnetic member 422a, the first magnetic member 421, and the second sub magnetic member 422b in due order.

In more detail, in the inserting state, as shown in FIGS. 3 and 4, the first magnetic portion 41 may be disposed above the first sub magnetic member 422a. That is, the first sub magnetic member 422a may be disposed below the first magnetic portion 41. Since the first magnetic portion 41 has a first magnetism and the second sub magnetic member 422a has a second magnetism, attraction may act on the first magnetic portion 41 and the first sub magnetic member 422a. Therefore, in the inserting state, the other side 2b of the display panel 2 to which the first magnetic portion 41 is coupled may be disposed in a line with the first sub magnetic member 422a coupled to the one side 3a of the first housing sidewall 31 in the Z-axis direction. Therefore, since the flexible display device 1 according to one aspect of the present disclosure may maintain the inserting state by using attraction between the first magnetic portion 41 and the first sub magnetic member 422a, a separate fixing device for fixing the display panel 2 to the housing 3 so as not to move the display panel 2 is not required, whereby a whole size and weight of the flexible display device may be reduced.

Meanwhile, in the inserting state, as shown in FIG. 5A, the second sub magnetic member 422b may be disposed at the same height as that of the first magnetic member 421. In this case, as shown in FIG. 5B, an elastic member 73 of the button portion 7 pulls the second sub magnetic member 422b from the Z-axis direction to the right side by using an elastic restoring force, whereby the second sub magnetic member 422b may pressurize an inclined surface 721 of the button portion 7. Therefore, an ascending member 71 and a moving member 72 of the button portion 7 may be disposed at an upper side in the Y-axis direction. In this specification, the Y-axis direction may mean a first axis direction, and the Z-axis direction may mean a second axis direction.

Next, when the inserting state is shifted to the unfolding state, the display panel 2 may move to the unfolding direction (the OD arrow direction) by the user's force, whereby the first magnetic portion 41 may be disposed at the upper side of the first magnetic member 421. In this case, since the first magnetic portion 41 and the first magnetic member 421 have N poles which are the same poles, repulsion may act on the first magnetic portion 41 and the first magnetic member 421. Therefore, when the inserting state is shifted to the unfolding state, repulsion acts if the first magnetic portion 41 is disposed at the upper side of the first magnetic member 421, whereby the user may move the display panel 2 in the unfolding direction (the OD arrow direction) by using a force smaller than that of the case that attraction acts.

The above principle may equally be applied to even the case that the first magnetic portion 41 is disposed at the upper side of the first magnetic member 421 when the unfolding state is shifted to the inserting state. Hereinafter, when the inserting state is shifted to the unfolding state, or vice versa, the case that the first magnetic portion 41 is disposed at the upper side of the first magnetic member 421 is defined as the shifted state.

Next, in the unfolding state, as shown in FIGS. 6A and 6B, the first magnetic portion 41 may be disposed at the other side 3b of the first housing sidewall 31. In this case, the first magnetic portion 41 may be disposed at a diagonal position from the second sub magnetic member 422b. In case of the inserting state and the shifted state, the first magnetic portion 41 may be disposed up and down to fact each of the first sub magnetic member 422a and the first magnetic member 421. However, in case of the unfolding state, the first magnetic portion 41 and the second sub magnetic member 422b may be disposed in a diagonal position without being disposed up and down. This is intended to make sure of a moving space of the second sub magnetic member 422b such that the second sub magnetic member 422b is disposed at the same height as that of the first magnetic portion 41 when the unfolding state is shifted to the inserting state. As the first magnetic portion 41 and the second sub magnetic member 422b are disposed in a diagonal position, attraction acts on the first magnetic portion 41 and the second sub magnetic member 422b, whereby the unfolding state may be maintained. Therefore, since the flexible display device 1 according to one aspect of the present disclosure does not need a separate fixing device for fixing the display panel 2 to the housing 3 so as not to move the display panel 2 in the unfolding state, its whole size and weight may be reduced.

Next, in the unfolding state, as shown in FIGS. 7A to 7C, the second sub magnetic member 422b may be disposed at the same height as that of the first magnetic portion 41. This is intended to generate repulsion by disposing the same poles in parallel in the X-axis direction after the second sub magnetic member 422b is disposed at the same height as that of the first magnetic portion 41. If the user pushes the ascending member 71 of the button portion 7 protruded from the housing 3, the ascending member 71 and the moving member 72 move to a lower side of the Y-axis direction which is the first axis direction, whereby the second sub magnetic member 422b may move to the upper side along the inclined surface 721 of the moving member 72 and thus may be disposed at the same height as that of the first magnetic portion 41. Therefore, the S pole may be disposed at the upper side of the first magnetic portion 41, and the S pole may also be disposed at the upper side of the second sub magnetic member 422b. The N pole may be disposed at the lower side of the first magnetic portion 41, and the N pole may also be disposed at the lower side of the second sub magnetic member 422b.

Consequently, in the flexible display apparatus 1 according to one aspect of the present disclosure, when the unfolding state is shifted to the inserting state, the user may push the button portion 7 and move the display panel 2 in the inserting direction (the ID arrow direction) by using repulsion between the first magnetic portion 41 and the second sub magnetic member 422b, whereby the user may shift the display panel 2 to the inserting state by using a force smaller than that of the case that the user moves the display panel 2 in the inserting direction (the ID arrow direction) without repulsion.

Referring to FIGS. 3 to 5A again, the gap retainer 5 is intended to maintain a gap between the first magnetic portion 41 and the second magnetic portion 42. The gap retainer 5 may be formed of a nonconductor, and may be disposed between the first magnetic portion 41 and the second magnetic portion 42. In more detail, the gap retainer 5 may be disposed to be in contact with a lower surface of the cover 36 and an upper surface of the second magnetic portion 42. Therefore, the gap retainer 5 may reduce attraction between the first magnetic portion 41 and the second magnetic member 42 as compared with the case that the lower surface of the first magnetic portion 41 is directly in contact with the upper surface of the second magnetic portion 42 by allowing the first magnetic portion 41 and the second magnetic portion 42 to be spaced apart from each other at a predetermined interval, whereby the user's force may be minimized when the inserting state is shifted to the unfolding state. The gap retainer 5 may be disposed only in the area where the first magnetic portion 41 and the second magnetic portion 42 are disposed, whereby a thickness and weight of the flexible display apparatus 1 may be prevented from being increased.

The cover 36 disposed on the upper surface of the gap retainer 5 may be disposed on the lower surface of the first magnetic portion 41, and thus covers the inside of the flexible display device 1 according to one aspect of the present disclosure to prevent the inside from being exposed to the outside even though the first magnetic portion 41 moves to the other side 3b of the first housing sidewall 31.

As shown in FIGS. 4 and 5A, the gap retainer 5 may be coupled to the first housing sidewall 31 by a bolt but is not limited thereto, and may be coupled to the first housing sidewall 31 by various coupling methods such as adhesive coupling. The gap retainer 5 may be provided to be longer than the first magnetic member 421, and both ends of the gap retainer 5 may be bent and then coupled to the first housing sidewall 31. In this case, the upper surface of the first magnetic member 421 may fully be in contact with the lower surface of the gap retainer 5, and the upper surface of the first sub magnetic member 422a may partially be in contact with the lower surface of the end of the gap retainer 5.

As the gap retainer 5 is coupled to the first housing sidewall 31, the first magnetic member 421 and the first sub magnetic member 422a, which are in contact with the lower surface of the gap retainer 5, may be fixed to the first housing sidewall 31 by the gap retainer 5. Therefore, even though the first magnetic portion 41 moves in accordance with movement of the display panel 2, the first magnetic member 421 and the first sub magnetic member 422a may be maintained to be fixed to the first housing sidewall 31.

The flexible display apparatus 1 according to one aspect of the present disclosure may further include an impact dispersion portion 21.

The impact dispersion portion 21 may be coupled to the rear surface of the display panel 2, as shown in FIGS. 3 to 5A. The impact dispersion portion 21 is intended to disperse impact applied to the display panel 2. The impact dispersion portion 21 may be made of a material that may absorb impact such as rubber. The impact dispersion portion 21 may be formed with the same size as that of the display panel 2 but is not limited thereto, and may be disposed only in the area where the magnetic portion 4 is disposed, so as to reduce a thickness and weight. If the impact dispersion portion 21 is coupled to the entire rear surface of the display panel 2, the display panel 2 may be prevented from being twisted or deformed in shape when the display panel 2 is enlarged or downsized.

Referring to FIGS. 3 to 7B, the stopper 6 is intended to restrict movement of the display panel 2.

The stopper 6 may include a first stopper 61 and a second stopper 62. The first stopper 61 may be disposed at one side 3a of the first housing sidewall 31. The first stopper 61 is intended to prevent the other side 2b of the display panel 2 from being protruded from the first housing sidewall 31 to the outside. That is, the first stopper 61 is intended to allow the display panel 2 not to move in the inserting state any more when the unfolding state is shifted to the inserting state. Referring to FIG. 4, the first stopper 61 may be provided in the form of 'L' and coupled to the first housing sidewall 31, and its horizontal portion is in contact with the upper surface of the first sub magnetic member 422a and its vertical portion supports the side of the first magnetic portion 41, thereby restricting movement of the first magnetic portion 41. Although not shown, the first stopper 61 may be coupled to the first housing sidewall 31 and thus support the first magnetic portion 41.

The second stopper 62 may be disposed at the other side 3b of the first housing sidewall 31. The second stopper 62 is intended to movement of the display panel 2 by preventing the other side 2b of the display panel 2 from passing through the second sub magnetic member 422b. In more detail, the second stopper 62 may restrict movement of the display panel 2 by restricting movement of the first magnetic portion 41 to prevent the first coupling portion 41 coupled to the other side 2b of the display panel 2 from passing through the second sub magnetic member 422b. That is, the second stopper 62 is intended to allow the display panel 2 disposed at the front rea A1 not to enlarge any more when the inserting state is shifted to the unfolding state. Referring to FIG. 7B, the second stopper 62 may be provided in the form of '⌐' and its horizontal portion is coupled to the first housing sidewall 31 and its vertical portion supports the side of the first magnetic portion 41, thereby restricting movement of the first magnetic portion 41.

The vertical portion of the second stopper 62 is disposed to be spaced apart from a guide member G (shown in FIG. 5A) of the flexible display apparatus 1 at a predetermined interval, whereby the second stopper 62 may additionally serve to guide the second sub magnetic member 422b together with the guide member G to move in the Z-axis direction.

The flexible display device 1 according to one aspect of the present disclosure may further include a button portion 7. The button portion 7 is intended to move the display panel 2 in the inserting direction (the ID arrow direction) at a predetermined distance by using repulsion when the unfolding state is shifted to the inserting state.

Referring to FIGS. 1A, 2 and 3 to 7C, the button portion 7 may include an ascending member 71, a moving member 72 and an elastic member 73.

The ascending member 71 may be coupled to the housing 3 to ascend in the Y-axis direction. The Y-axis direction may be, but not limited to, parallel with a direction on which gravity acts. If the Y-axis direction is parallel with a gravity direction, the ascending member 71 may be moved up and down. The ascending member 71 may be formed in, but not limited to, a long cylindrical shape. If the display panel 2 is shifted from the unfolding state to the inserting state by a user's manipulation, the ascending member 71 moves in a downward direction, whereby the display panel 2 may be slid in the inserting direction (the ID arrow direction) at a predetermined distance. The ascending member 71 may include a head portion 711 and a body portion 712.

The head portion 711, as shown in FIG. 1A, may correspond to a button externally protruded from the flexible display apparatus 1. The head portion 711 may movably be coupled to the first housing sidewall 31 and thus may be moved in the Y-axis direction in accordance with a user's manipulation or an elastic restoring force of the elastic member 73. The head portion 711 may be formed to be partially protruded from the first housing sidewall 31 and thus may easily be manipulated by the user. However, without limitation this example, the head portion 711 may be formed so as not to be protruded from the first housing sidewall 31 to provide unity with the first housing sidewall 31.

The body portion 712 may be coupled to a lower surface of the head portion 711. Therefore, the body portion 712 may move together according to the movement of the head portion 711. The body portion 712 may movably be coupled to each of the first housing sidewall 31 and the second housing sidewall 32. The body portion 712 may be inserted into a through hole or groove formed in each of the first housing sidewall 31 and the second housing sidewall 32. The body portion 712 may longitudinally be extended from the first housing sidewall 31 to the second housing sidewall 32 to move the moving member 72. The body portion 712 may be provided in a long cylindrical shape but is not limited thereto, and may be provided in another shape if it is movably coupled to the first housing sidewall 31 and the second housing sidewall 32 to move the moving member 72.

The moving member 72 is intended to move the second sub magnetic member 422b in the Z-axis direction in accordance with movement of the ascending member 71. Referring to FIG. 5B, the moving member 72 may include an inclined surface 721 inclined with respect to the lower surface of the second sub magnetic member 422b. Therefore, the moving member 72 may be provided in a triangular shape in its section. A corner portion of the second sub magnetic member 422b may be in contact with the inclined surface 721, and the second sub magnetic member 422b may be moved in the Z-axis direction by an elastic restoring force of the elastic member 73 or a user's force for pushing the button portion 7 in a state that the second sub magnetic member 422b is in contact with the inclined surface 721.

In more detail, in the inserting state of FIGS. 5A and 5B, the second sub magnetic member 422b is moved to be far away from the impact dispersion portion 21 by the elastic restoring force of the elastic member 73 and thus the moving member 72 may be moved to the upper side in the Y-axis direction of FIG. 5B. Therefore, the head portion 711 of the ascending member 71 may be maintained to be protruded from the first housing sidewall 31 as shown in FIG. 1A.

On the other hand, when the inserting state is shifted to the unfolding state as shown in FIGS. 7B and 7C, the user pushes the head portion 711 of the ascending member 71, and thus the moving member 72 is moved to the lower side in the Y-axis direction of FIG. 7C, whereby the second sub magnetic member 422b may be moved until it is in contact with the lower surface of the impact dispersion portion 21 along the inclined surface 721. Therefore, the elastic member 73 may be elongated as shown in FIG. 7C. The second sub magnetic member 422b may be disposed at the same height as that of the first magnetic portion 41 as shown in FIG. 7B. Therefore, when the unfolding state is shifted to the inserting state, if the user pushes the button portion 7, repulsion may act between the first magnetic portion 41 and the second sub magnetic member 422b, whereby the display panel 2 may be moved in the inserting direction (the ID arrow direction) at a predetermined distance. As a result, the user may move the display panel 2 in the inserting direction (the ID arrow direction) at a force less than the case that repulsion does not act.

The elastic member 73 is intended to protrude the ascending member 71 from the first housing sidewall 31 along the elastic restoring force. One side of the elastic member 73 may be coupled to the first housing sidewall 31, and the other side of the elastic member 73 may be coupled to the second sub magnetic member 422b. The elastic member 73 may be contracted by the elastic restoring force, whereby the second sub magnetic member 422b may be spaced apart from the impact dispersion portion 21 or the lower surface of the display panel 2. If the user pushes the head portion 711 as described above, the elastic member 73 may be elongated in the Z-axis direction as an area of the moving member 72 overlapped with the second sub magnetic member 422b is increased.

Referring to FIG. 7B, two elastic members 73 may be spaced apart from each other and coupled to the second sub magnetic member 422b and the first housing sidewall 31. The ascending member 71 and the moving member 72 may be disposed between the elastic members 73. Therefore, the ascending member 71, the moving member 72 and the elastic member 73 may not interfere with one another.

The flexible display apparatus 1 according to one aspect of the present disclosure may further include a first coupling member 8 and a second coupling member 9.

The first coupling member 8, as shown in FIGS. 2 and 7A, may be coupled to the one side 2a of the display panel 2 such that the first coupling member 8 is disposed between the first side 2c and the second side 2d of the display panel 2. For example, the first coupling member 8 may be formed in a rod shape having a cross-section in the form of an arrowhead. The first coupling member 8 may be made of, but not limited to, a metal material and may be formed of a plastic material for weight-lightness. The first coupling member 8 may closely be coupled to the display panel 2 from the one side 2a of the display panel 2 to the first and second sides 2c and 2d of the display panel 2, and thus, even when the one side 2a of the display panel 2 is unfolded from the housing 3, flatness of the display panel 2 may be maintained.

The first coupling member 8 may be coupled to the display panel 2 in a lengthwise direction of each of the first side 2c and the second side 2d of the display panel 2 by various coupling methods such as the adhesive coupling method and the fitting-coupling method. The first coupling member 8 may include a flat member 81 and a protrusion member 82.

The flat member 81 may be inserted into the coupling groove 37 formed in the housing 3. The coupling groove 37 may be provided in an engraved form in the first housing sidewall 31 and may be communicated with the guide groove 311. Therefore, when the unfolded state is shifted to the inserted state, the flat member 81 may move in the inserting direction (the ID arrow direction) together with the display panel 2 and may be inserted into the coupling groove 37. As the flat member 81 is inserted into the coupling groove 37, the one side 2a of the display panel 2 may be disposed inside the housing 3.

The coupling groove 37, as shown in FIGS. 2 and 7A, may be provided at the front area A1 in a position where the third housing sidewall 33 is coupled to the first housing sidewall 31. Therefore, when the flat member 81 is inserted into the coupling groove 37, the third housing sidewall 33 may be in contact with the flat member 81. Therefore, since the third housing sidewall 33 may support the first coupling member 8, the third housing sidewall 33 may prevent the display panel 2 from being bent toward the accommodating groove 35 in the inserted state, thereby maintaining flatness of the display panel 2. The coupling groove 37 may be provided to be thicker than the guide groove 311 so that the display panel 2 and the flat member 81 may be inserted thereinto.

The protrusion member 82 may be exposed to the outside of the housing 3. The protrusion member 82 may be formed to be thicker than the flat member 81 so that the protrusion member 82 may not be inserted into the coupling groove 37. The protrusion member 82 according to one example may be more protruded toward the front area A1 than the flat member, and may be formed to be gradually reduced in its thickness toward the unfolding direction (the OD arrow direction). For example, the protrusion member 82, as shown in FIG. 7A, may be formed in a fan shape. The protrusion member 82 may be supported in the first housing sidewall 31 when its surface vertical to the flat member 81 is in the inserting state. In more detail, the vertical surface of the protrusion member 82 may be supported in the first housing sidewall 31 adjacent to the coupling groove 37. Therefore, in the flexible display device 1 according to one aspect of the present disclosure, the first coupling member 8 may prevent the one side 2a of the display panel 2 from being inserted into the housing 3 even though the unfolding state is shifted to the inserting state, whereby the size of the display panel 2 disposed at the front area A1 without a separate fixing device may be maintained.

Also, in the flexible display device 1 according to one aspect of the present disclosure, since the protrusion member 82 may be exposed to the outside without being inserted into the coupling groove 37, the user may easily enlarge the display panel 2 from the inserting state to the unfolding state by gripping the protrusion member 82 exposed to the outside.

Also, in the flexible display device 1 according to one aspect of the present disclosure, since the first coupling member 8 is provided to surround the one side 2a of the display panel 2, the one side 2a of the display panel 2 may be protected from external impact, whereby lifetime of the display panel 2 may be more increased.

The second coupling member 9, as shown in FIGS. 2, 4 and 7B, may be coupled to the other side 2b of the display panel 2 such that it may be disposed between the first side 2c and the second side 2d of the display panel 2. The second coupling member 9 according to one example may be coupled to the other side 2b of the display panel 2 by various coupling methods such as the adhesive coupling method, the fitting-coupling method and the bolt-coupling method. The second coupling member 9 may be provided in a rod shape where a cross-sectional surface has a shape of "□". The second coupling member 9 may longitudinally be disposed along the other side 2b of the display panel 2 to reduce impact of the other side 2b of the display panel 2 and the first housing sidewall 31 when the second coupling member 9 is shifted to the inserting state. To this end, the second coupling member 9 may be made of a material that may absorb impact. For example, the second coupling member 9 may be made of rubber but is not limited thereto, and may be made of another material that may absorb impact.

The second coupling member 9 may closely be coupled to the display panel 2 from the other side 2b of the display panel 2 to the first and second sides 2c and 2d of the display panel 2, and thus may maintain flatness of the other side 2b of the display panel 2. That is, the second coupling member 9 may closely be coupled to the other side 2b of the display panel 2, and thus, may prevent the other side 2b of the display panel 2 from being deformed such as crumpled and may protect the other side 2b of the display panel 2 from external impact, thereby more increasing a lifetime of the display panel 2.

Figure 8A:
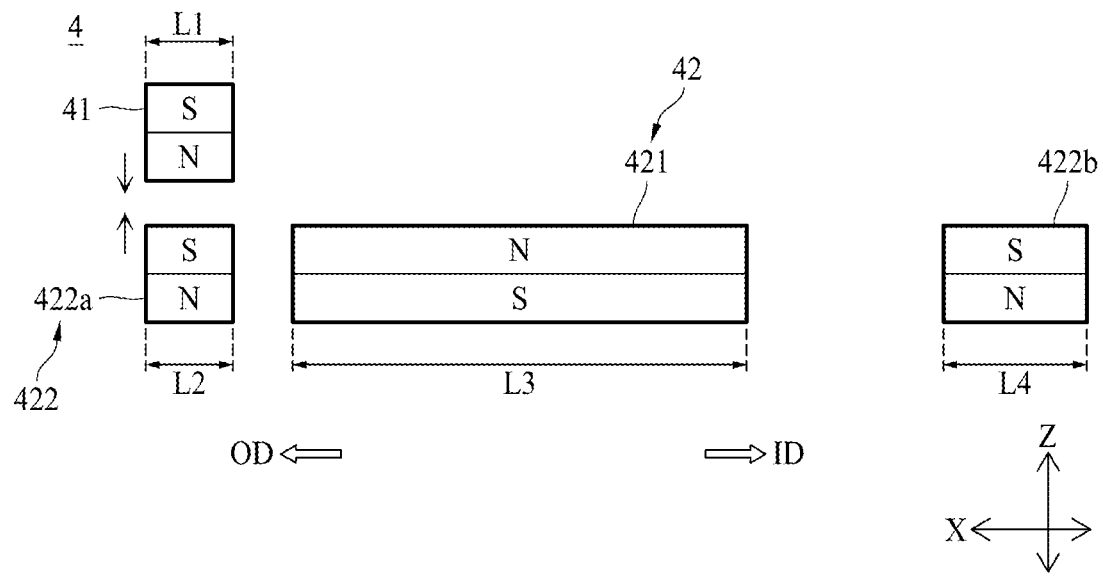
FIG. 8A is a schematic operation state view of a magnetic portion during an inserted state.
Figure 8B:
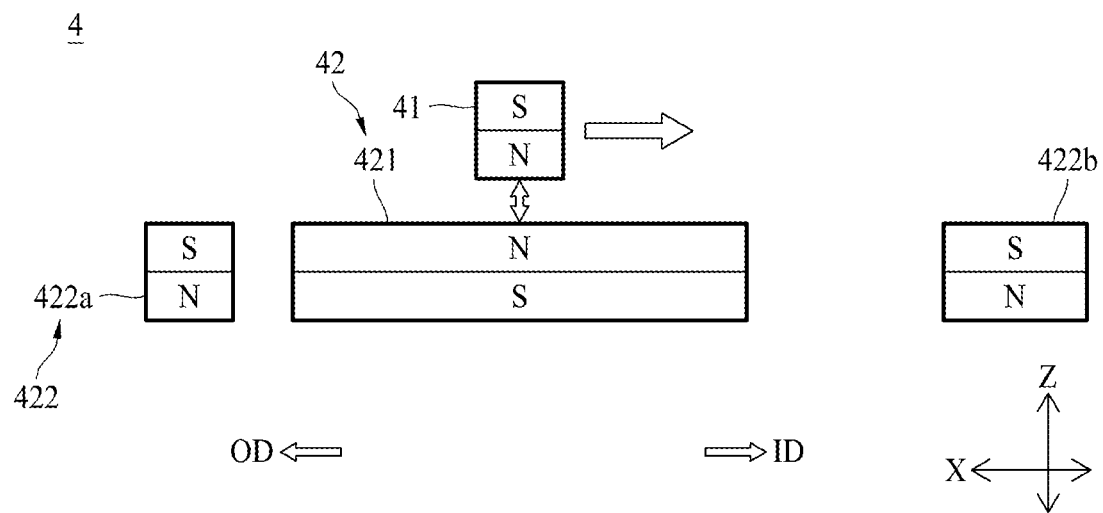
FIG. 8B is a schematic operation state view of a magnetic portion when an inserted state is shifted to an unfolded state.
Figure 8C:
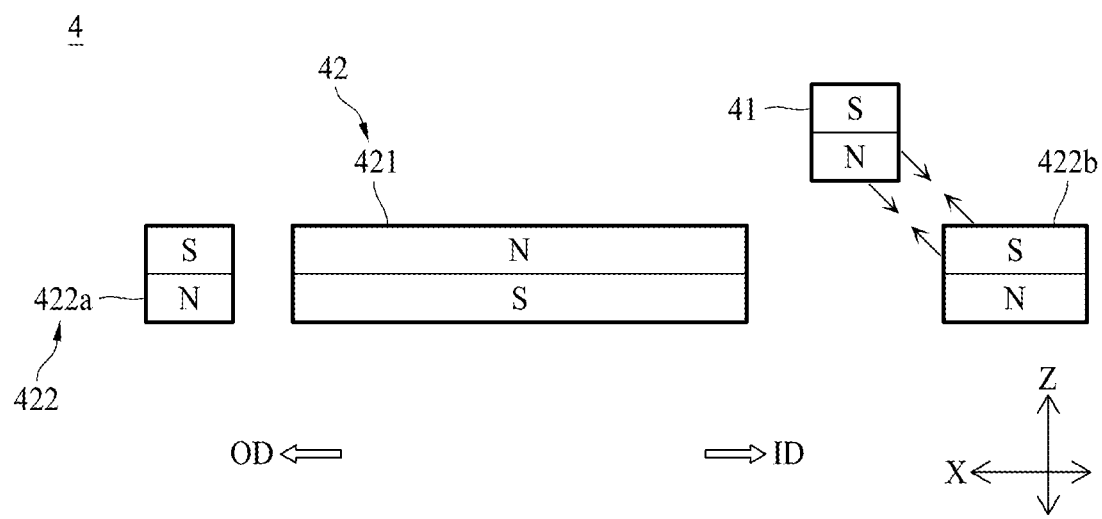
FIG. 8C is a schematic operation state view of a magnetic portion during an unfolded state.
Figure 8D:
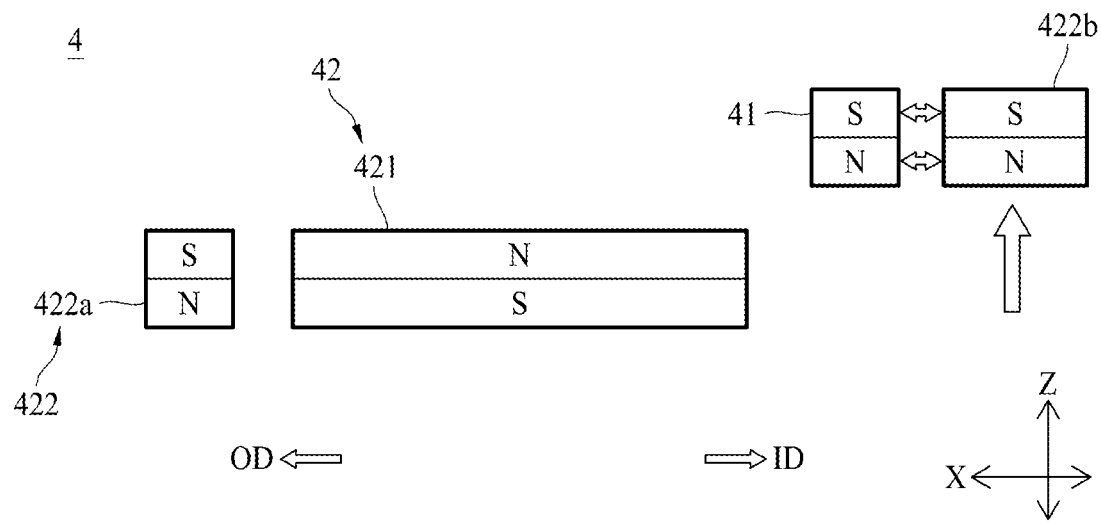
FIG. 8D is a schematic operation state view of a magnetic portion when an unfolded state is shifted to an inserted state.

FIG. 8A is a schematic operation state view of a magnetic portion during an inserted state, FIG. 8B is a schematic operation state view of a magnetic portion when an inserted state is shifted to an unfolded state, FIG. 8C is a schematic operation state view of a magnetic portion during an unfolded state, and FIG. 8D is a schematic operation state view of a magnetic portion when an unfolded state is shifted to an inserted state.

FIGS. 8A to 8D are schematic views illustrating FIGS. 3 to 7C. In more detail, FIGS. 8A to 8D are schematic views illustrating an inserting state, a shifting state, and an unfolding state of the flexible display apparatus 1 and a magnetic portion 4 when an unfolding state is shifted to an inserting state. Therefore, hereinafter, a description of FIGS. 8A to 8D will be given with reference to FIGS. 3 to 7C.

FIG. 8A is a schematic view illustrating an inserting state of the flexible display apparatus 1, wherein the display panel 2 is fully inserted into the housing 3. The first magnetic portion 41 and the second sub magnetic member 422a are disposed up and down (or in a line) in the Z-axis direction. Since attraction acts on the N pole of the first magnetic portion 41 and the S pole of the second sub magnetic member 422a, the display panel 2 may be maintained in an inserting state without moving to the housing 3. Consequently, since the flexible display apparatus 1 according to one aspect of the present disclosure may maintain the inserting state by using attraction between the first magnetic portion 41 and the first sub magnetic member 422a without a separate fixing device, a whole size and weight of the flexible display apparatus 1 may be more reduced than the case that a separate fixing device for fixing the display panel is provided.

Meanwhile, a second length L2 of the first sub magnetic member 422a may be equal to or longer than a first length L1 of the first magnetic portion 41. This is because that the display panel 2 may be moved even in case of small impact due to a small size of attraction the inserting state if the length of the first sub magnetic member 422a is shorter than the length of the first magnetic portion 41.

A third length L3 of the first magnetic member 421 may be longer than the second length L2 of the first sub magnetic member 422a. This is because that a moving path of the other side 2b of the display panel 2 is long until the display panel 2 is shifted from the inserting state to the unfolding state as shown in FIGS. 3 and 6A. In more detail, since the first magnetic portion 41 coupled to the other side 2b of the display panel 2 should move from the one side 3a of the housing 3 to the other side 3b to be completely shifted to the unfolding state, the first magnetic member 421 having a pole different from that of the first magnetic portion 41 is provided with the third length L3 longer than the second length L2 so that the user may move the display panel 2 in the above path with a minimum force. Therefore, since repulsion acts between the first magnetic portion 41 and the first magnetic member 421 in the shifting state, the user may move the display panel 2 with a small force.

A fourth length L4 of the second sub magnetic member 422b may be smaller than the third length L3 and longer than the second length L2. If the fourth length L4 is equal to or longer than the third length L3, a width of the display apparatus becomes too long, whereby the user may feel inconvenience in carrying the display apparatus.

If the fourth length L4 is shorter than the second length L2, attraction between the first magnetic portion 41 and the second sub magnetic member 422b is reduced, whereby a problem may occur in that it is difficult to maintain the unfolding state.

The reason why the fourth length L4 of the second sub magnetic member 422b is longer than the second length L2 of the first sub magnetic member 422a is to allow the ascending member 71 and the moving member 72 of the button portion 7 to be disposed between multiple elastic members 73 as shown in FIG. 7B. This is because that the ascending member 71 and the moving member 72 should be disposed between the multiple elastic members 73 such that the ascending member 71 and the moving member 72 may be disposed longitudinally to reach the second housing sidewall 32, thereby shifting the display panel 2 from the unfolding state to the inserting state as shown in FIG. 2. Therefore, in the flexible display apparatus 1 according to one aspect of the present disclosure, the user may push the head portion 711 of the ascending member 71 disposed in the first housing sidewall 31 with his/her one hand to simultaneously move the first and second sides 2c and 2d of the display panel 2 disposed up and down in the Y-axis direction in the inserting direction (the ID arrow direction) at a predetermined distance, thereby preventing the display panel 2 from being deformed such as crumpled.

Next, FIG. 8B is a schematic view illustrating a shifting state of the flexible display apparatus 1, wherein the first magnetic portion 41 coupled to the other side 2b of the display panel 2 is moved in the unfolding direction (the OD arrow direction). The first magnetic portion 41 and the first magnetic member 421 are disposed up and down in the Z-axis direction. In this case, since repulsion acts on the N pole of the first magnetic portion 41 and the N pole of the first magnetic member 421, the other side 3b of the display panel 2 may be more spaced apart from the second magnetic portion 42 in the Z-axis direction than the aforementioned inserting state. Consequently, since the flexible display apparatus 1 according to one aspect of the present disclosure may be provided to minimize the user's force by using repulsion between the first magnetic portion 41 and the first magnetic member 421 when the display panel 2 is enlarged or downsized using the user's force.

Next, FIG. 8C is a schematic view illustrating an unfolding state of the flexible display apparatus 1, wherein the first magnetic portion 41 is disposed at the other side 3b of the housing 3. The first magnetic portion 41 and the second sub magnetic member 422b are disposed in a diagonal direction. In this case, since attraction acts on the N pole of the first magnetic portion 41 and the S pole of the second sub magnetic member 422b, the display panel 2 may be maintained in the unfolding state without being moved from the housing 3 any longer. Consequently, since the flexible display apparatus 1 according to one aspect of the present disclosure may maintain the unfolding state by using attraction between the first magnetic portion 41 and the second sub magnetic member 422b without a separate fixing device, its whole size and weight may be more reduced than the case that a separate fixing device for fixing the display panel is provided.

The reason why the first magnetic portion 41 is not disposed to reach the upper side of the second sub magnetic member 422b in FIG. 8C is to make sure of a moving space of the second sub magnetic member 422b such that the second sub magnetic member 422b is disposed at the same height as that of the first magnetic portion 41 as shown in FIG. 8D.

Next, FIG. 8D is a schematic view illustrating an unfolding state of the flexible display apparatus 1 is shifted to an inserting state, wherein the first magnetic portion 41 and the second sub magnetic member 422b are disposed at the same height. In more detail, the user may push the ascending member 71 of the button portion 7 protruded from the first housing sidewall 31 to allow the moving member 72 to pressurize the second sub magnetic member 422b, whereby the second sub magnetic member 422b may ascend in the Z-axis direction in a state that it is in contact with the inclined surface 721 of the moving member 72. Therefore, the second sub magnetic member 422b may be disposed at the same height as that of the first magnetic portion 41, whereby repulsion may act between the second sub magnetic member 422b and the first magnetic portion 41. Consequently, since the flexible display apparatus 1 according to one aspect of the present disclosure may move the other side 2b of the display panel 2 in the inserting direction (the ID arrow direction) at a predetermined distance by using repulsion between the first magnetic portion 41 and the second sub magnetic member 422b, whereby the unfolding state may be shifted to the inserting state more easily.

In conclusion, since the flexible display apparatus 1 according to one aspect of the present disclosure may be provided to minimize the user's force by using a magnetic force of the magnetic portion 4 when the display panel 2 (or the display area) disposed at the front area A1 is enlarged or downsized using the user's hand gesture, and may maintain the inserted state and the unfolded state of the display panel 2 (or the display area) by using the magnetic force, a separate fixing device is not required, whereby a whole size and weight of the flexible display apparatus may be reduced.

It will be apparent to those skilled in the art that the present disclosure described above is not limited by the above-described aspects and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

The various aspects described above can be combined to provide further aspects. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the aspects can be modified, if necessary to employ concepts of the various patents, applications and publications to provide yet further aspects.

These and other changes can be made to the aspects in light of the above-detailed description. In general, in the following claims, the terms used should not be construed to limit the claims to the specific aspects disclosed in the specification and the claims, but should be construed to include all possible aspects along with the full scope of equivalents to which such claims are entitled. Accordingly, the claims are not limited by the disclosure.

What is claimed is:

1. A flexible display apparatus comprising:
a display panel;
a housing movably supporting the display panel;
a magnetic portion coupled to the display panel and the housing;
a gap retainer disposed between the first magnetic portion and the second magnetic portion; and
a cover disposed between the first magnetic portion and the gap retainer,
wherein the magnetic portion includes:
a first magnetic portion coupled to one side of the display panel and having a first magnetism; and
a second magnetic portion including a first magnetic member coupled to the housing to face the first magnetic portion and having the first magnetism and a second magnetic member having a second magnetism opposite to the first magnetism.

2. The flexible display apparatus of claim 1, wherein the first magnetic member and the second magnetic member are spaced apart from each other and dot not vertically overlap with each other.

3. The flexible display apparatus of claim 1, wherein the first magnetic member and the second magnetic member are spaced apart from each other and disposed along a moving direction of the display panel.

4. The flexible display apparatus of claim 1, wherein the second magnetic member includes two sub magnetic members that are respectively disposed at one side and the other side of the housing.

5. The flexible display apparatus of claim 4, wherein the first magnetic member is disposed between the two sub magnetic members.

6. The flexible display apparatus of claim 1, wherein the first magnetic member has a length longer than that of the second magnetic member.

7. The flexible display apparatus of claim 1, wherein the second magnetic member has a length equal to or longer than that of the first magnetic portion.

8. The flexible display apparatus of claim 1, wherein the display panel includes a first area, a second area and a third area, and at least one of the first area, the second area and the third area outputs an image different from those of the other areas.

9. The flexible display apparatus of claim 1, further comprising an impact dispersion portion coupled to a rear surface of the display panel.

10. The flexible display apparatus of claim 1, wherein the housing includes:
a first housing sidewall supporting a first side corner of the display panel;
a second housing sidewall disposed in parallel with the first housing sidewall and supporting a second side corner of the display panel;
a third housing sidewall connected to one side of the first housing sidewall and one side of the second housing sidewall; and
a guide roller rotatably connected to the other side of the first housing sidewall and the other side of the second housing sidewall.

11. The flexible display apparatus of claim 1, further comprising a stopper disposed in each of the one side and the other side of the housing and restricting movement of the display panel.

12. The flexible display apparatus of claim 1, wherein the second magnetic member includes a plurality of magnetic members, and one of the second magnetic members is disposed below the first magnetic portion.

13. The flexible display apparatus of claim 1, wherein the second magnetic member includes a plurality of magnetic members, and one of the second magnetic members is disposed at the same height as that of the first magnetic portion when an unfolding state is shifted to an inserting state.

14. A flexible display apparatus comprising:
a display panel;
a housing movably supporting the display panel;
a magnetic portion coupled to the display panel and the housing; and
a button portion movably coupled to the housing,
wherein the magnetic portion includes:
a first magnetic portion coupled to one side of the display panel and having a first magnetism; and
a second magnetic portion including a first magnetic member coupled to the housing to face the first magnetic portion and having the first magnetism and a second magnetic member having a second magnetism opposite to the first magnetism,
wherein the second magnetic member includes a plurality of magnetic members, and
wherein the button portion includes an ascending member coupled to the housing to ascend in a first axis direction, and a moving member moving one of the second magnetic members in a second-axis direction in accordance with movement of the ascending member.

15. The flexible display apparatus of claim 14, further comprising an elastic member for protruding the ascending member from the housing in accordance with an elastic restoring force, wherein the elastic member has one side coupled to the housing and the other side coupled to one of the second magnetic members.

16. The flexible display apparatus of claim 14, wherein the moving member includes an inclined surface inclined with respect to a lower surface of the second magnetic member, and wherein the second magnetic member is moved in the second axis direction in a state that it is in contact with the inclined surface.

17. A flexible display apparatus comprising:
a display panel including a display area;
a housing movably supporting the display panel; and
a first magnetic portion coupled to the display panel and having a first magnetism;
a second magnetic portion including first and second magnetic members and coupled to the housing to face the first magnetic portion;
a gap retainer disposed between the first magnetic portion and the second magnetic portion; and
a cover disposed between the first magnetic portion and the gap retainer, wherein the first magnetic member has the first magnetism and the second magnetic member having a second magnetism opposite to the first magnetism, and wherein the display area is enlarged or downsized by magnetic forces of the first and second magnetic members.

18. The flexible display apparatus of claim 17, further comprising a gap retainer disposed between the first magnetic portion and the second magnetic portion.

* * * * *